United States Patent [19]

Shirai

[11] Patent Number: 5,168,624
[45] Date of Patent: Dec. 8, 1992

[54] METHOD OF MANUFACTURING PRINTED WIRING BOARD

[75] Inventor: Junzaburo Shirai, Saitama, Japan

[73] Assignee: Nippon CMK Corp., Japan

[21] Appl. No.: 670,301

[22] Filed: Mar. 15, 1991

[30] Foreign Application Priority Data

Jul. 18, 1990 [JP] Japan ................... 2-190158

[51] Int. Cl.⁵ ............................... H05K 3/02
[52] U.S. Cl. ........................ 29/846; 29/852; 156/901; 156/902; 156/904; 427/96; 427/97
[58] Field of Search ............ 29/852, 846; 427/97, 427/96; 156/901, 902, 904

[56] References Cited

U.S. PATENT DOCUMENTS

| | | | |
|---|---|---|---|
| Re. 33,108 | 11/1987 | Ishikawa et al. | 29/852 X |
| 4,671,854 | 6/1987 | Ishikawa et al. | 29/852 X |
| 4,673,458 | 6/1987 | Ishikawa et al. | 29/852 X |
| 4,705,592 | 11/1987 | Bahrle et al. | 29/852 X |
| 4,712,297 | 12/1987 | Wolfram | 29/852 |
| 4,755,551 | 7/1988 | Nakano et al. | 427/97 X |
| 4,830,880 | 5/1989 | Okubi et al. | 427/97 X |
| 4,983,252 | 1/1991 | Masui et al. | 29/852 X |

Primary Examiner—Carl J. Arbes
Attorney, Agent, or Firm—Bruce L. Adams; Van C. Wilks

[57] ABSTRACT

A method of manufacturing a printed wiring board on a cubically molded substrate enables formation of high-precision printed circuits fully compatible with the complex configuration of the cubic substrate. The manufacturing method includes initially forming a conductive layer on the surface of a cubic substrate followed by etching the conductive layer. The method includes the steps of forming electrodeposited resist on the conductive layer, exposing the electrodeposited resist to parallel light beams through a planar photomask, and etching the conductive layer to complete the formation of the printed circuit.

15 Claims, 2 Drawing Sheets

METHOD OF MANUFACTURING PRINTED WIRING BOARD

BACKGROUND OF THE INVENTION

The present invention relates to a method of manufacturing a printed wiring or circuit board more particularly, it relates to a method of manufacturing a cubic or three-dimensional printed wiring board.

There are a variety of conventional methods of manufacturing a printed wiring board based on a cubically molded substrate including the double-shot process, transfer process, and the etching process for example. Of these, the etching process is executed either by forming etching resist via a pad printing means or by forming etching resist by exposing and developing photo-resist by applying a cubic mask.

According to the conventional double-shot process, palladium catalyzer is uniformly dispersed in a resinous region (of the cubic substrate) available for forming circuits, and then the resinous region is molded. Next, in order to secure those regions formed by the first and second molds, only the region available for forming circuits is externally expose before being molded. No catalyzer is added to the resinous region subject to molding by the second mold.

Next, the molded substrate is subject to a preliminary treatment by applying chromic acid so that the surface of the molded substrate can be roughed, followed by the execution of an electrolysis-free copper plating process before eventually forming printed circuits in the predetermined region.

The conventional transfer process uses transfer papers. More specifically, a transfer film that superficially contains a conductive circuit pattern is preliminarily set to a resin mold available for molding cubic substrate, and then, via the molding process, the circuit pattern of the transfer film is transferred onto the molded substrate. There is another conventional process for plating a circuit pattern in a mold in addition to the above process. In particular, this conventional process provides slits corresponding to circuit pattern inside of an extrusion mold, and then coats the surface of the mold other than the slits with resist by applying a roller printing method. Next, a metallic layer is formed solely on the slits by applying an electrolytic metal plating process. Next, the resist is removed from the mold surface and then an extrusion molding process is executed by means of an extrusion mold. Finally, the circuit pattern composed of a metallic layer electrolytically deposited on the mold surface is transferred onto the molded substrate.

Among the transfer processes, there is such a conventional process for transferring the predetermined circuit pattern onto the molded substrate. More specifically, circuit pattern is printed on a transfer film across a screen, and then, the circuit pattern is coated with an adhesive agent. Next, the circuit pattern of the transfer film is brought into contact with the transfer-receptive region of the molded substrate by precisely matching both positions. Next, the molded substrate is heated and pressed until the coated adhesive agent becomes fully solidified. Finally, after stripping off the transfer film, the circuit pattern is already on the transfer-receptive region of the molded substrate, thus completing the whole transfer process.

When applying the conventional etching process, initially, the surface of a cubically molded substrate is processed so as to have an adequate roughness. Next, a metallic layer available for composing a circuit conductor is coated o the whole surface of the cubically molded substrate by electrolytic and non-electrolytic plating processes. Next, etching resist corresponding to the predetermined circuit pattern is formed, and finally, the metallic layer is etched to complete the formation of the predetermined circuit pattern on the surface of the cubically molded substrate.

Conventionally, there are two ways of forming the etching resist during the manufacturing process. One of these method forms the etching resist by transferring resist ink to the surface of metallic layer by applying a pad printing process. The other method forms the etching resist by initially coating the whole surface of the metallic layer with liquid photo-resist, by applying either a dipping process or a spraying method, followed by processes for exposing and developing the coated photo-resist across a cubic mask before eventually forming the etching resist.

When forming printed circuits on a cubically molded substrate by applying the conventional double-shot process mentioned earlier, there is a certain restriction on the selection of material available for the initial molding process, in the compatibility with a palladium catalyzer. In addition, there is also a certain restriction on the resinous material available for implementing the first and second molding processes due to consideration of thermal compatibility. Furthermore, since the mold is quite expensive, the conventional double-shot process is by no means economical. In addition, there is a certain limit in terms of applicable line width (0.2 mm), interval (0.2 mm) and critical pitch (0.4 mm) which are respectively essential for the manufacture of the mold. Since there is a critical limit in the total length of circuits, the designing of circuits is limited.

Furthermore, when applying the conventional transfer process with transfer papers, each transfer operation against the cubic substrate having complex configuration is very difficult. In addition, it is difficult to form the cubically molded substrate and it is also difficult to provide precise correct positions for the circuit patterns. In particular, the plating of the circuit pattern in the mold expensive on the way of manufacturing the mold. Furthermore, since the circuit pattern is plated in the mold, the line width and the interval are respectively restricted to 0.2 mm. Furthermore, a plating process must be executed against the mold whenever molding the objective substrate, thus diminishing the availability for implementing mass production.

On the other hand, the conventional method of transferring the circuit pattern subsequent to the molding of the substrate also involves difficulty in following the complex configuration of the cubic substrate. Also, the circuit pattern is bonded to the substrate with adhesive agent, creating a problem with regards to the peeling strength.

Furthermore, when applying the conventional etching process to form the etching resist based on the pad printing process, difficulty is also present in following the complex configuration of the cubic substrate. In addition, there is a certain limit in the line width and the interval of circuits, also, it is difficult to provide a durable thickness of etching resist. Furthermore, the conventional etching process is defective because of an inability to design through holes in the circuit pattern.

On the other hand, when forming the etching resist from photo-resist, it is difficult to uniformly coat liquid photo-resist on the whole surface of a cubic substrate without causing pin holes to occur. It is also difficult to form a cubic photo-mask that correctly matches the configuration of the cubic substrate. This makes the production process very costly. Furthermore, there is a critical limit in the formation of pattern containing fine conductive lines.

SUMMARY OF THE INVENTION

An object of the present invention is to alleviate the defects inherent in the conventional methods of manufacturing a printed wiring board on a cubically molded substrate. Another object of the invention is to provide a novel method of manufacturing a printed wiring board on a cubically molded substrate by forming high-precision printed circuits fully compatible with the complex configuration of a cubic substrate at an inexpensive cost so as to allow manufacturers to produce these printed circuits on the mass production basis.

The invention provides a novel method of manufacturing a printed wiring board by initially forming a conductive layer on the surface of a cubic substrate followed by a step of etching the conductive layer before eventually forming printed circuits. The method embodied by the invention further comprises the steps of: forming electrodeposited resist on the conductive later; exposing the electrodeposited resist to parallel light beams; and etching the conductive layer to complete the formation of printed circuits.

According to the invention, based on the application of electrolytically deposited resist, uniform and thin resist perfectly compatible with the complex configuration of the cubic substrate can securely be generated. In addition, by virtue of exposing the electrolytically deposited resist to parallel light beams, the method embodied by the invention dispenses with the cubic mask corresponding to the cubic configuration of the substrate. The method embodied by the invention allows a manufacturer to flexibly design patterns and effectively promote precision of cubically disposed printed circuits in full compatibility with the complex configuration of the cubic substrate.

DETAILED DESCRIPTION OF THE INVENTION

Referring now to the accompanying drawings, an embodiment of the invention is described below.

Figure 1:
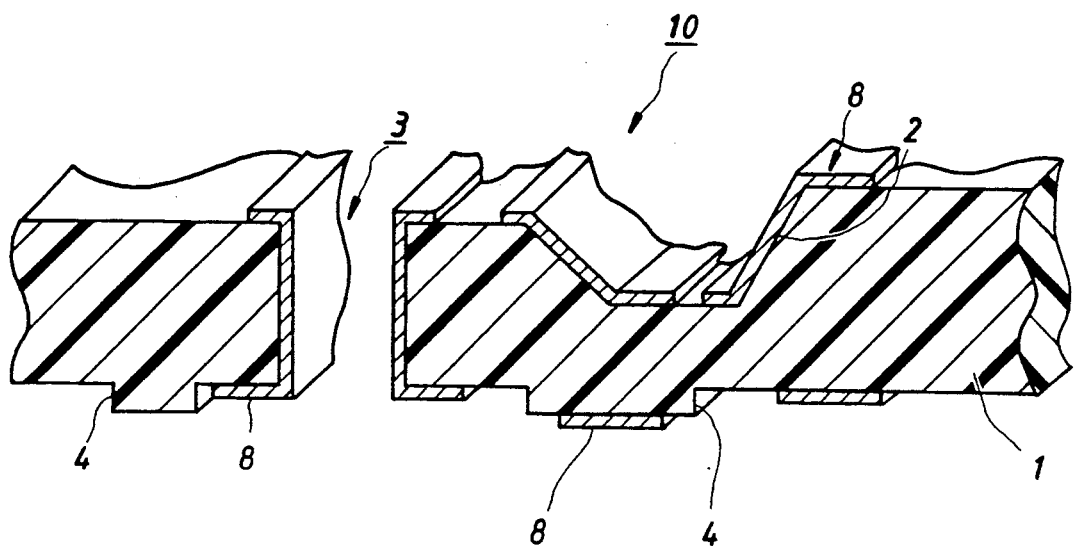
FIG. 1 shows a partial sectional view of a three-dimensional printed wiring board manufactured according to the method embodied by the invention.
Figure 2:
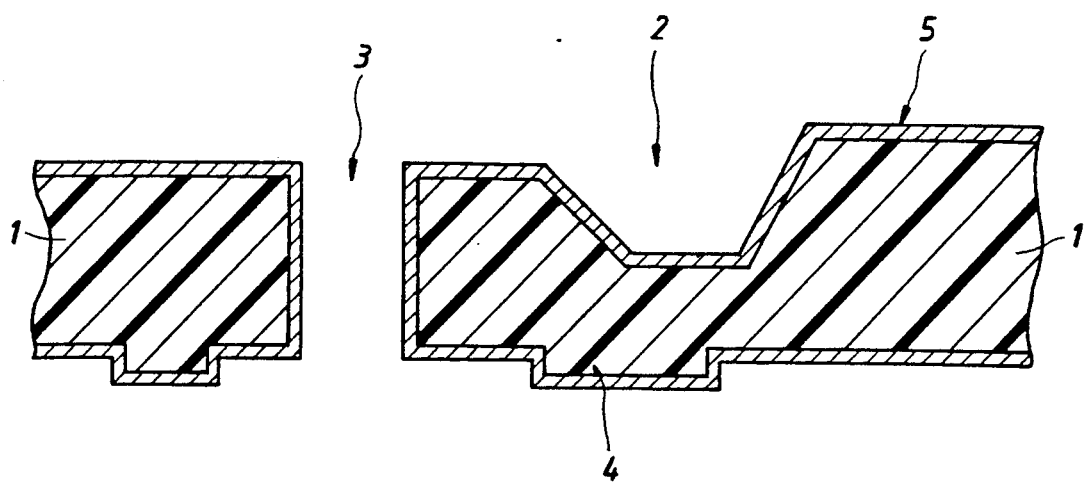
FIGS. 2 through 4 are respectively the partial sectional views of the printed wiring board and show the method of manufacturing the printed wiring board according to the invention.
Figure 3:
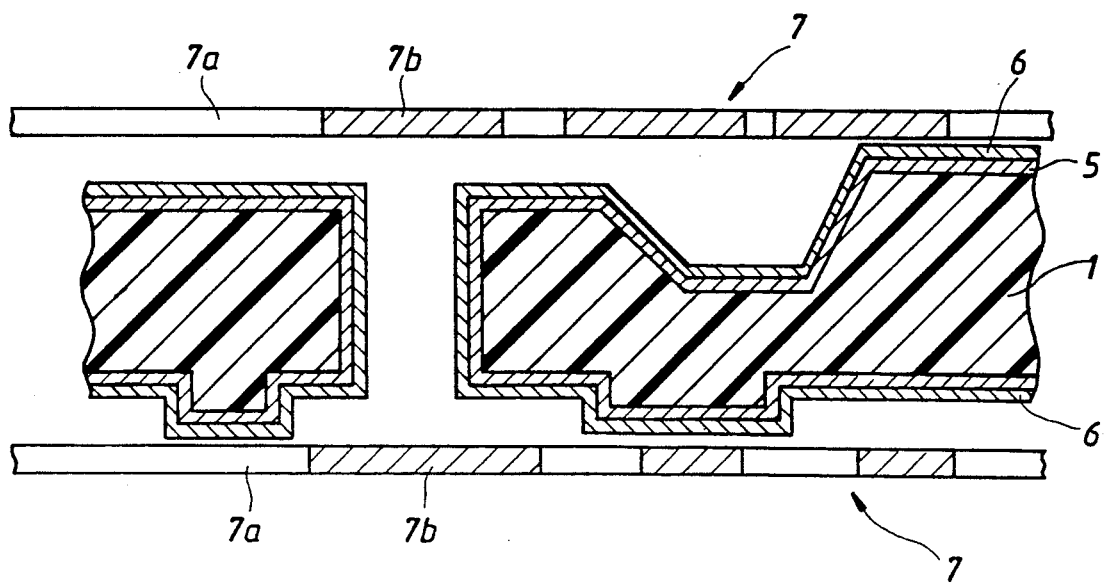
Figure 4:
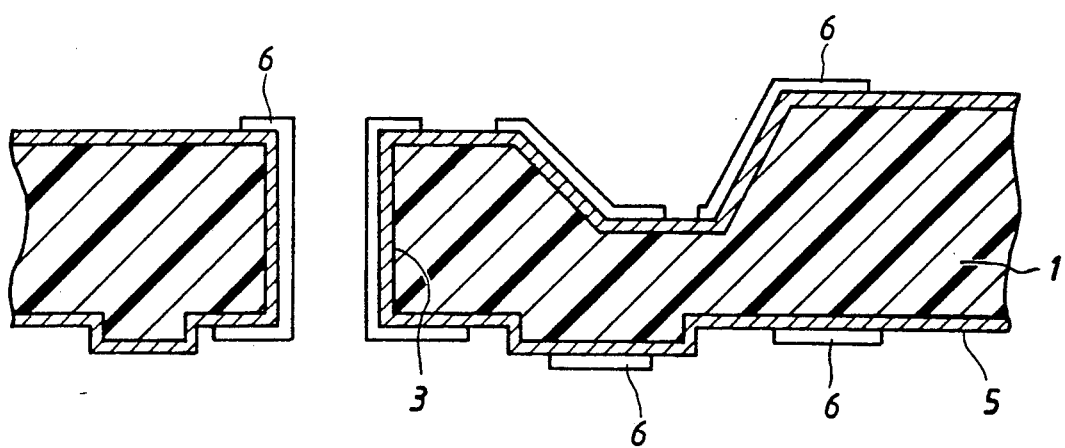

FIG. 1 designates a partial sectional view of the printed wiring board manufactured in accordance with the method embodied by the invention. FIGS. 2 through 4 are respectively partial section views of the printed wiring board embodied by the invention.

The manufacturing steps according to the invention starts with the molding of a cubic or three-dimensional substrate 1 which is formed according to the predetermined configuration and available for the printed wiring board 10 by applying an extrusion molding process to heat-resistant resin like "Super Empra" for example.

Next, as shown in FIG. 2, the whole surface of the cubic substrate 1 including a recess 2, a through-hole 3, a bottom projection 4, and other plane surfaces, is preliminarily treated with an organic solvent and chromic acid for roughing the whole surface. Then, by applying non-electrolytic and electrolytic plating processes, the whole surface of the cubic substrate 1 is uniformly coated with a metallic film 5 having such a thickness as to match a specific thickness needed for the conductor of printed circuits 8. The above preliminary treatment provides sufficient adhesive strength.

Next, as shown in FIG. 3, an electrolytically depositing resist 6 (positive-type electrolytically depositing resist) is coated on the metallic film 5. Next, a photo-mask 7 composed of a plane sheet having an exposed region 7a and nonexposed region 7b are conjunctionally set to the top and bottom surfaces of the cubic substrate 1. Next, the electrolytically depositing resist 6 is exposed to parallel light beams emitted from an exposure light unit (not shown) across those photo-masks 7 provided on both surfaces of the cubic substrate 1.

The exposed region 7a and the non-exposed region 7b of those photo-mask are disposed in order that resist image corresponding to the circuit pattern of the printed circuits 8 set to the cubic substrate 1 can be generated. By providing the exposed region 7a and the non-exposed region 7b of the photo-mask 7 on the top and bottom surfaces of the cubic substrate 1, in correspondence with the circuit pattern of the cubic substrate 1, the electrolytically deposited resist 6 is exposed to the parallel light beams at those positions corresponding to the exposed region 7 during the exposing process, whereas the rest of the electrolytically deposited resist 6 at those positions corresponding to the non-exposed region 7b is not exposed to the parallel light beams.

In consequence, as shown in FIG. 4, the exposed region 7a of the photo-mask 7 is decomposed by developing the electrolytically deposited resist 6 after completing the exposing process, whereas the non-exposed region 7b of the photo-mask 7 remains in the form of resist image.

Therefore, by executing an etching process against the metallic film 5 across the resist image shown in FIG. 4, the cubic printed wiring board 10 based on the cubic substrate 1 complete with the printed circuits 8 shown in FIG. 1 is eventually formed.

After completing the etching process, as is conventionally practiced, the resist 6 is stripped off, and then the complete printed wiring board is cleaned by washing.

As is clear from the above description, according to the invention, a novel method is provided for the manufacture of a printed wiring board, which initially forms a conductive layer on the whole surface of a cubic substrate, and then etches the conductive layer before eventually forming printed circuits. More particularly, by virtue of the formation of electrolytically deposited resist on the conductive layer, extremely thin and uniform photo-resist can securely be formed on the complex configuration of the cubic substrate irrespective of the complex configuration of the cubic substrate. This in turn significantly promotes precision of the circuit patterns.

Furthermore, parallel light beams are made available for exposing the photo-resist, thus eliminating the need of using cubic photo-mask corresponding to the complex configuration of the cubic substrate. Furthermore, by providing plane photo-mask without closely adhering to the cubic substrate, the predetermined resist image corresponding to the cubic configuration of the substrate can effectively be generated. The plane photo-mask is flexibly compatible with variation of the circuit pattern and also with more the complex configuration of the cubic substrate as well.

What is claimed is:

1. A method of manufacturing a printed circuit board, comprising the steps of:
    forming a substrate having an exterior surface, at least one portion of the surface having a higher elevation than another portion of the surface;
    forming a conductive layer on the surface at portions thereof that are at different elevations;
    forming an electrolytically deposited resist on the conductive layer;
    selectively exposing the resist to parallel light beams through a photomask to form a circuit pattern of nonexposed resist;
    removing the exposed resist to expose areas of the conductive layer not covered by the non-exposed resist; and
    etching the exposed areas of the conductive layer to form the conductive layer having the circuit pattern.

2. A method of manufacturing a printed circuit board according to claim 1; wherein the photomask comprises a planar photomask.

3. A method of manufacturing a printed circuit board according to claim 2; further comprising the step of roughing the surface of the substrate before forming the conductive layer.

4. A method of manufacturing a printed circuit board according to claim 3; wherein the step of roughing includes applying at least one of an organic solvent and chromic acid to the surface of the substrate.

5. A method of manufacturing a printed circuit board according to claim 1; further comprising the step of forming at least one through-hole in the substrate before forming the conductive layer.

6. A method of manufacturing a printed circuit board according to claim 1; wherein the surface includes a top surface and a bottom surface of the substrate, and at least one of the top surface and the bottom surface has at least one portion thereof having a higher elevation than another portion thereof.

7. A method of manufacturing a printed circuit board according to claim 1; further comprising the step of removing the resist covering the conductive layer forming the circuit pattern.

8. A method of manufacturing a printed circuit board according to claim 1; wherein the resist is a positive-type electrolytically deposited resist.

9. A method of manufacturing a printed circuit board, comprising the steps of:
    forming a substrate having an exterior surface, at least one portion of the surface having a higher elevation than another portion of the surface;
    forming a conductive layer on the surface at portions thereof that are at different elevations;
    forming an electrolytically deposited resist on the conductive layer;
    selectively exposing the resist to parallel light beams through a planar photomask to form a circuit pattern, wherein the planar photomask at most contacts only a portion of the resist covering the portion of the surface having the highest elevation;
    removing portions of the resist not forming the circuit pattern to expose areas of the conductive layer; and
    etching the exposed areas of the conductive layer to form the conductive layer having the circuit pattern.

10. A method of manufacturing a printed circuit board according to claim 9; further comprising the step of roughing the surface of the substrate before forming the conductive layer.

11. A method of manufacturing a printed circuit board according to claim 10; wherein the step of roughing includes applying at least one of an organic solvent and chromic acid to the surface of the substrate.

12. A method of manufacturing a printed circuit board according to claim 9; further comprising the step of forming at least one through-hole in the substrate before forming the conductive layer.

13. A method of manufacturing a printed circuit board according to claim 9; wherein the surface includes a top surface and a bottom surface of the substrate, and at least one of the top surface and the bottom surface has at least one portion thereof having a higher elevation than another portion thereof.

14. A method of manufacturing a printed circuit board according to claim 9; further comprising the step of removing the resist covering the conductive layer forming the circuit pattern.

15. A method of manufacturing a printed circuit board according to claim 9; wherein the resist is a positive-type electrolytically deposited resist.

* * * * *